United States Patent [19]

Ogasawara

[11] Patent Number: 5,289,050
[45] Date of Patent: Feb. 22, 1994

[54] CLOCK SIGNAL SELECTION CIRCUIT

[75] Inventor: Jin Ogasawara, Yokohama, Japan

[73] Assignee: Victor Company of Japan, Ltd., Japan

[21] Appl. No.: 68,570

[22] Filed: May 28, 1993

Related U.S. Application Data

[63] Continuation of Ser. No. 860,462, Mar. 30, 1992, abandoned.

[30] Foreign Application Priority Data

Mar. 29, 1991 [JP] Japan .................. 3-121967

[51] Int. Cl.⁵ .................. H03K 5/13; H03K 5/22; H03K 7/00; H03K 17/00
[52] U.S. Cl. .................. 307/269; 307/272.1; 307/480; 307/605; 307/231; 307/528; 328/63; 328/66; 328/72
[58] Field of Search ............ 307/231, 528, 269, 272.1, 307/605, 606; 328/55, 66, 63, 72, 156

[56] References Cited

U.S. PATENT DOCUMENTS

| | | | |
|---|---|---|---|
| 4,697,279 | 9/1987 | Baratti et al. | 307/272.1 |
| 4,755,704 | 7/1988 | Flora et al. | 307/606 |
| 4,929,850 | 5/1990 | Breuninger | 307/272.2 |
| 4,965,524 | 10/1990 | Patchen | 307/269 |
| 5,099,141 | 3/1992 | Utsunomiya | 307/269 |

FOREIGN PATENT DOCUMENTS 144114 2/1989 Japan .

Primary Examiner—William L. Sikes
Assistant Examiner—Trong Phan
Attorney, Agent, or Firm—Lowe, Price, LeBlanc & Becker

[57] ABSTRACT

A clock signal selection circuit includes a delay for delaying a switching control signal to supply a delayed switching control signal. A first selection circuit changes its state between first and second states in response to the switching control signal. A second selection circuit changes its circuit condition between third and fourth states in response to the switching control signal and the output of first selection circuit. The second selection circuit outputs a second clock signal when operated in the third state and inhibits the second clock signal in the fourth state. The first selection circuit supplies the first clock signal when operated in the first state and inhibits the first clock signal from being supplied when operated in the second state in response to the switching control signal and the output of second selection circuit. A third selection circuit transmits the switching control signal to either the first or second selection circuit in response to the delayed control signal.

5 Claims, 6 Drawing Sheets

CLOCK SIGNAL SELECTION CIRCUIT

This application is a continuation of application Ser. No. 07/860,462 filed Mar. 30, 1992 now abandoned.

BACKGROUND OF THE INVENTION

1. Field of the Invention

This invention relates to a clock signal selection circuit.

2. Description of the Prior Art

A clock signal selection circuit for selecting one of first and second clock signals. FIG. 5 is a logic circuit diagram of a first prior art clock signal switching circuit. FIG. 6 shows waveforms of outputs at respective portions of the first prior art clock signal switching circuit.

The first prior art clock signal switching circuit shown in FIG. 5 comprises a first gate G11 for effecting operation of AND between a control signal and a first clock signal CLK1, a second gate G12 for effecting operation of AND between a control signal and a second clock signal CLK2, and an OR gate G13 for effecting operation of OR between outputs of the first and second gates G11 and G12.

As shown in FIG. 6, the first prior art clock signal selection circuit changes the outputting of the first clock signal CLK1 from that of the second clock signal CLK2 in response to the control signal CONT to produce a selected clock signal CLK13.

FIG. 7 is a logic circuit diagram of a second prior art clock signal selection circuit. The second prior art clock signal selection circuit comprises first and second D type flip-flops F1 and F2, first, second, and third gates G14, G15, G16, first and second delay circuits DY1 and DY2 and an inverter IV1. FIG. 8 is a time chart showing respective outputs of the second prior art clock signal selection circuit. As shown in FIG. 8, when the control signal CONT is H, an output Q2 of the second flip-flop F2 is logic H, so that the second clock signal CLK2 is selected. This causes an output Q1 of the first flip-flop F1 to be L, so that outputting of the first clock signal CLK1 is inhibited. When the control signal goes to L, the output Q2 of the flip-flop F2 goes to logic L and the output Q1 of the flip-flop F1 goes to H, so that outputting of the second clock signal CLK2 is inhibited and that of the first clock signal CLK1 is permitted.

FIG. 9 is a logic circuit diagram of a third prior art clock signal selection circuit. The third prior art clock signal selection circuit has fourth and fifth gates G17 and G18 in addition to a structure of the second prior art wherein the D type flip-flops F1 and F2 with the reset inputs are replaced with D type flip-flop F3 and F4 having no reset input.

In the first prior art clock signal selection circuit, there is a problem that it generates a short obstructive pulse Px during switching operation as shown in FIG. 8. In the second and third prior art clock signal selection circuits, delay circuits DY1 and DY2 are used to prevent hazard. However, there is a problem that hazard is not prevented sufficiently because there is two portions which judge the logic level of the control signal, so that there is a possibility that the first flip-flop and the second flip-flop F1 and F2 output different results due to time delay. Moreover, in the second and third prior arts, there is a further problem that in the manufacturing of integrated circuit including this clock signal selection circuit is difficult because there is analog type delay circuits DY1 and DY2 whose delay time should be controlled in the manufacturing processing.

SUMMARY OF THE INVENTION

The present invention has been developed in order to remove the above-described drawbacks inherent to the conventional clock signal selection circuit.

According to the present invention there is provided a first clock signal selection circuit comprising: first and second selection circuits; first and second holding circuits for holding an input level therein at its output in response to first and second clock signals respectively; first and second gate circuits; a delay for delaying a switching control signal to produce a delayed switching control signal, wherein the first selection circuit selects either of the switching control signal or an output of the second holding circuit in accordance with the delayed switching control signal; the first holding circuit holds an output of the first selection selection circuit in phase with a first clock signal; the second selection circuit selects either of the switching control signal or an output of the first holding circuit in accordance with the delayed switching control signal; the second holding circuit holds an output of the second selection circuit in phase with a second clock signal; the first gate circuit outputs a first clock signal in accordance with an output of the first holding circuit; and the second gate circuit outputs a second clock signal in accordance with an output of the second holding circuit.

According to the present invention there is also provided a second clock signal selection circuit as mentioned in the first clock signal selection circuit, further comprising:

a third gate circuit for operating and outputting a logic NOR of outputs of the first and second gate circuit.

According to the present invention there is also provided a third clock signal selection circuit as mentioned in the second clock signal selection circuit, wherein the delay circuit comprises a plurality of D type flip-flop circuits for delaying the switching control signal in response to an output of the third gate circuit.

According to the present invention there is also provided a fourth clock signal selection circuit comprising: a delay for delaying a switching control signal to produce a switching delayed control signal; a first selection circuit for changing its circuit condition between first and second conditions in response to the switching control signal; a second selection circuit for changing its circuit condition between third and fourth conditions in response to the switching control signal and the output of first selection circuit, second selection circuit outputting a second clock signal in the third condition, the second selection circuit inhibiting the second clock signal to be passed in the fourth condition, the first selection circuit outputting the first clock signal in the first condition, the first selection circuit inhibiting the first clock signal to be passed in the second condition in response to the switching control signal and the output of second selection circuit; and a third selection circuit for sending the switching control signal to either of the first or second selection circuit which is determined in accordance with the delayed control signal.

According to the present invention there is also provided a fifth clock signal selection circuit as mentioned in the fourth clock signal selection circuit, further comprising: a gate circuit for operating and outputting a logic NOR of outputs of the first and second selection circuit circuit.

According to the present invention there is also provided a sixth clock signal selection circuit as claimed in the fifth clock signal selection circuit, wherein the delay circuit comprises a plurality of D type flip-flop circuits for delaying the switching control signal in response to an output of the gate circuit.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Figure 1:
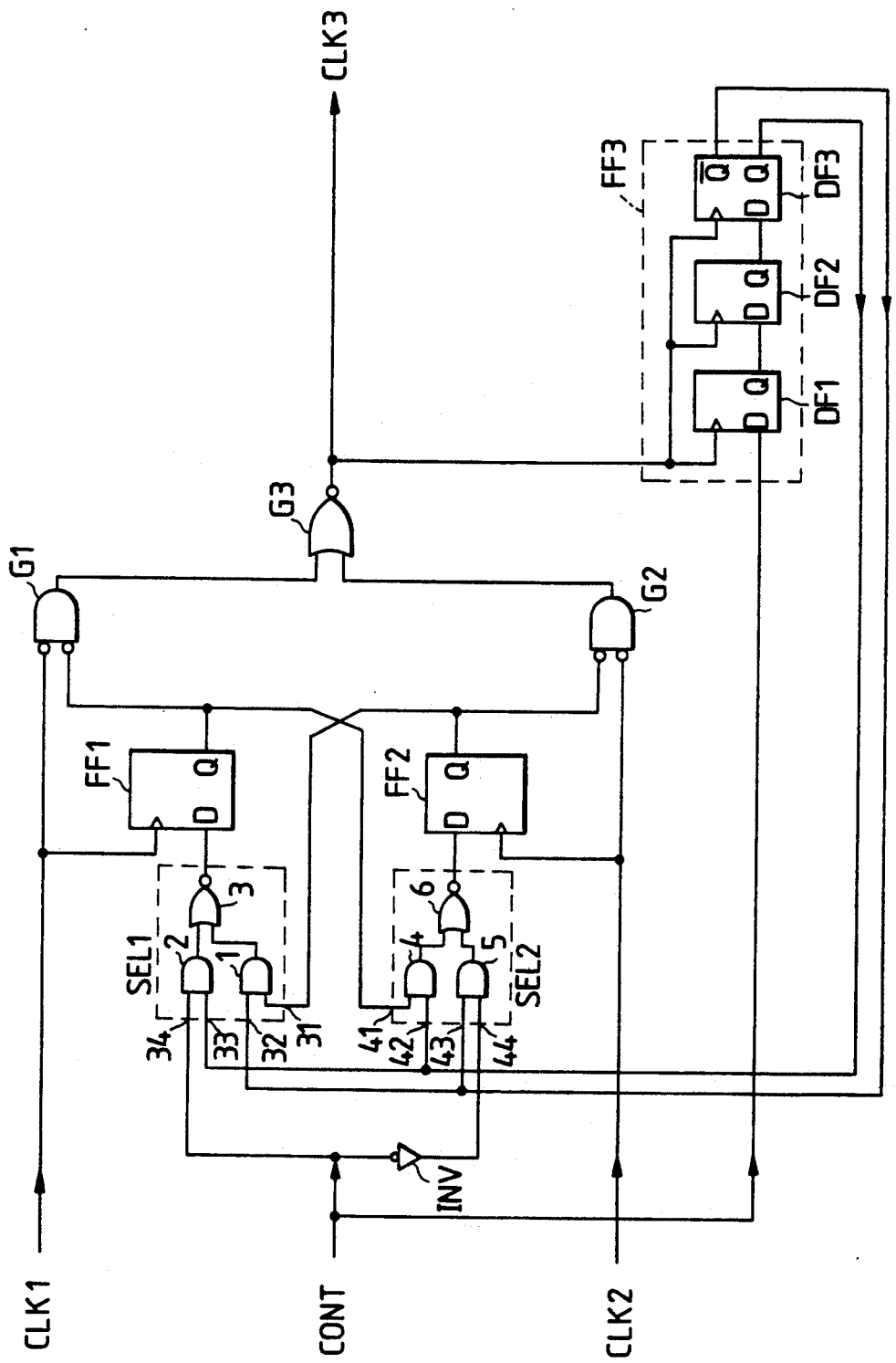
FIG. 1 is a logic circuit diagram of the first embodiment of this invention of clock signal selection circuit.

Hereinbelow will be described a first embodiment of this invention with reference to drawings. FIG. 1 is a logic circuit diagram of the first embodiment of this invention of a clock signal selection circuit.

A first clock signal CLK1 is applied to one input of a gate circuit G1 and to a clock pulse input of a flip-flop FF1. The other input of the gate circuit G1 is supplied with a Q output of the flip-flop FF1. The Q output of the flip-flop FF1 is applied to a first input 41 of a selection circuit SEL2 also. A data (D) input of the flip-flop FF1 is supplied with an output of a selection circuit SEL1.

A second clock signal CLK2 is applied to one input of a gate circuit G2 and to a clock pulse input of a flip-flop FF2. The other input of the gate circuit G2 is supplied with a Q output of the flip-flop FF2. The Q output of the flip-flop FF2 is applied to a first input 31 of the selection circuit SEL1 also. A data (D) input of the flip-flop FF2 is supplied with an output of the selection circuit SEL2.

A control signal CONT is applied to a fourth input 34 of the selection circuit SEL1 and to a fourth input 44 of the selection circuit SEL2 through an inverter INV.

A Q output of a flip-flop circuit FF3 is applied to a third input 33 of the selection circuit SEL1 and to a second input 42 of the selection circuit SEL2. A $\bar{Q}$ output of the flip-flop circuit FF3 is applied to a second input 32 of the selection circuit SEL1 and to a third input 43 of the selection circuit SEL2.

The selection circuit SEL1 comprises a first two-input AND gate 1, a second two-input AND gate 2, and a two-input NOR gate 3. The selection circuit SEL2 comprises a first two-input AND gate 4, a second two-input AND gate 5, and a two-input NOR gate 6. First inputs of the first AND gates 1 and 4 correspond to the first inputs 31 and 41 of the selection circuits SEL1 and SEL2, respectively. Second inputs of the first AND gates 1 and 4 correspond to the second inputs 32 and 42 of the selection circuits SEL1 and SEL2, respectively. First inputs of the second AND gates 2 and 5 correspond to the third inputs 33 and 43 of the selection circuits SEL1 and SEL2, respectively. Second inputs of the second AND gates 2 and 5 correspond to each of the fourth inputs 34 and 44 of the selection circuit SEL1 and SEL2, respectively. The NOR gate 3 of the selection circuit SEL1 responds to outputs of the first and second AND gates 1 and 2 of the selection circuits SEL1. The NOR gate 6 of the selection circuit SEL2 responds to outputs of the first and second AND gates 4 and 5 of the selection circuit SEL2. An output of the NOR gate 3 of the selection circuit SEL1 is sent to the flip-flop FF1 as the output of the selection circuit SEL1. An output of the NOR gate 6 of the selection circuit SEL2 is sent to the flip-flop FF2 as the output of the selection circuit SEL2.

Outputs of the gate circuits G1 and G2 are sent to inputs of a two-input NOR gate G3. The NOR gate G3 produces a clock signal CLK3 as an output of the clock selection circuit of the embodiment through NOR operation and the clock signal CLK3 is sent to a clock signal input of the flip-flop circuit FF3.

The flip-flop circuit FF3 comprises three D type flip-flops DF1, DF2, and DF3. Each of clock pulse inputs of the three D type flip-flops DF1, DF2, and DF3 is supplied with the clock signal CLK3. The control signal CONT is applied to a data (D) input of the first flip-flop DF1 of the flip-flop circuit FF3. A D input of the second D type flip-flop DF2 is supplied with an output of the first D type flip-flop DF1. A D input of the third D type flip-flop DF3 is supplied with an output of the second D type flip-flop DF2. That is, the first, second, and third D type flip-flops DF1, DF2, and DF3 of the flip-flop circuit FF3 are cascaded to perform a shift register operation.

Figure 2:
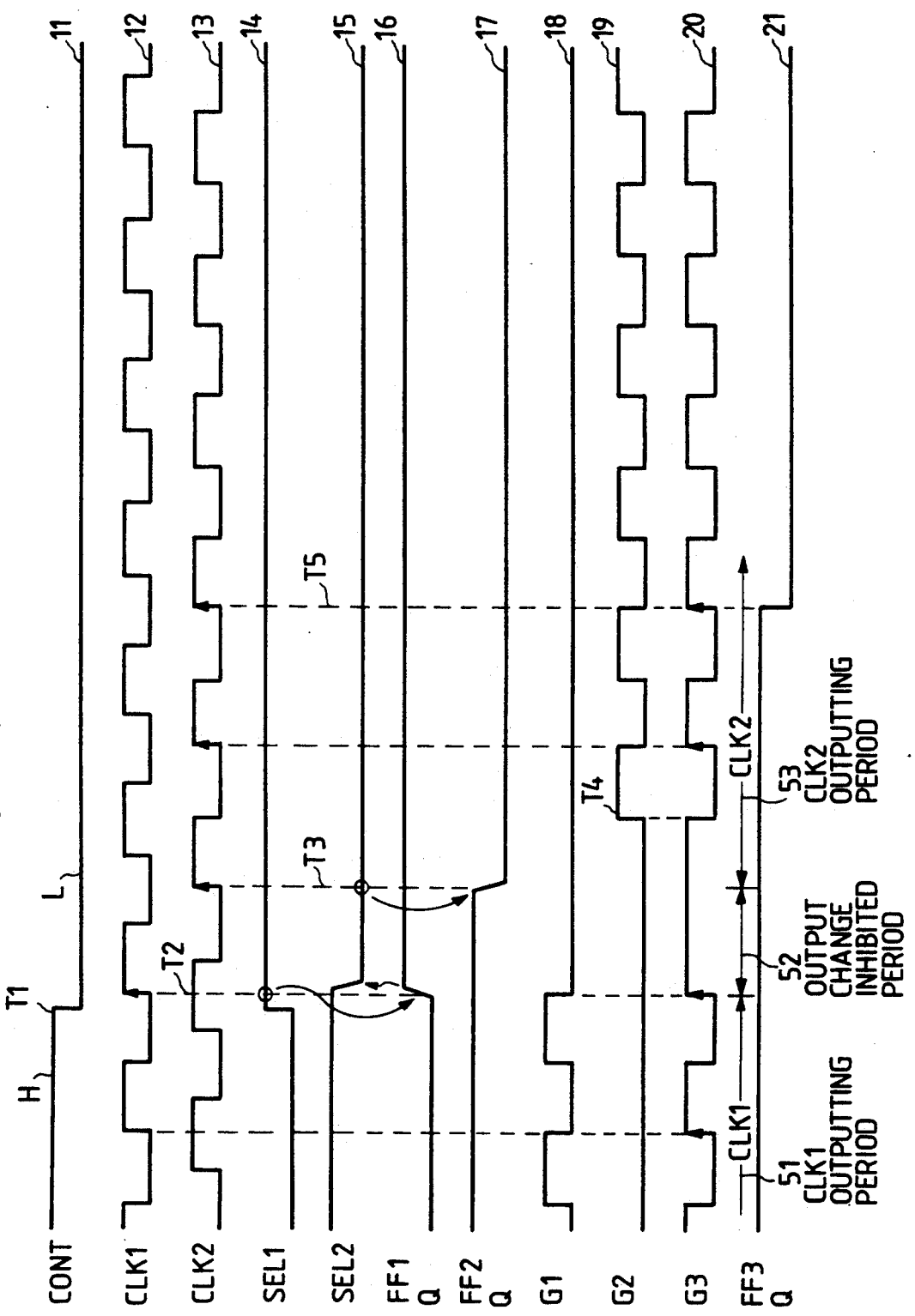
FIG. 2 is a time chart showing waveforms of outputs of the clock signal selection circuit of this embodiment.

Hereinbelow will be described operation of the first embodiment. FIG. 2 is a time chart showing waveforms of outputs of the clock signal selection circuit of this embodiment during switching of the clock signal from the clock signal CLK1 to clock signal CLK2. In FIG. 2, waveform 11 shows level change of the control signal CONT; waveform 12 shows level change of the clock signal CLK1; waveform 13 shows level change of the clock signal CLK2; waveform 14 shows level change of the output of the selection circuit SEL1; waveform 15 shows level change of the output of the selection circuit SEL2; waveform 16 shows level change of the Q output of the flip-flop FF1; waveform 17 shows level change of the Q output of the flip-flop FF2; waveform 18 shows level change of the output of the gate circuit G1; waveform 19 shows level change of the output of the gate circuit G2; waveform 20 shows level change of the output of the gate circuit G3; and waveform 21 shows level change of the Q output of the flip-flop circuit FF3.

The selection circuit SEL1 selects either of the control signal CONT or the Q output signal of the flip-flop FF2 in accordance with condition of flip-flop circuit FF3, that is in accordance with Q and $\bar{Q}$ outputs of the flip-flop circuit FF3, and outputs the inversion of the selected signal. More specifically, in FIG. 2 as shown by the waveform 21, before a timing T5, the Q output of the flip-flop circuit FF3 enables the AND gates 2 and 4. On the other hand, $\overline{Q}$ output of the flip-flop FF3 disables the AND gates 1 and 3 before the timing T5. Therefore, when a logic level of the control signal CONT is changed from H to L at a timing T1 as shown by the waveform 11, only output of the selection circuit SEL 1 changes at first.

The Q and $\overline{Q}$ outputs of the flip-flop circuit FF3 do not change before the timing T5, so that the gate 5 is disabled up to the timing T5. In other words, the flip-flop circuit FF3 determines which outputs of the selection circuits SEL1 and SEL2 and should be changed in response to the control signal CONT. In fact, in this embodiment, the Q and $\overline{Q}$ outputs of the flip-flop circuit FF3 changes at T5 as shown by waveform 21 to provide a surer switching operation.

The flip-flop FF1 holds a logic level of the output of the selection circuit SEL 1 at its Q output in synchronism with the clock signal CLK 1. Thus, the Q output of the flip-flop FF1 changes from L to H just after the timing T1, that is, at the timing T2 in response to change in logic level of the output of the selection circuit SEL1 from L to H and then it holds the output level as shown by the waveform 16. Therefore, the Q output of the flip-flop FF1 of logic H inhibits the gate circuit G1 from outputting an inverted clock signal CLK1. At the same instance, the Q output of the flip-flop FF1 changes a logic output level of the selection circuit SEL 2 from H to L at the timing T2 as shown by the waveform 15. Therefore, the flip-flop FF2 changes its Q output level from H to L in response to the next positive-going edge (denoted as a timing T3) of the clock signal CLK 2 as shown by the waveform 17. This is because the clock pulse input of the same is supplied with the clock signal CLK2. Between the timings T2 and T3, both the gate circuits G1 and G2 are inhibited from outputting the clock signals CLK1 and CLK2 due to the logic H of the Q outputs of the flip-flops FF1 and FF2, and the output level of the gate circuit G3 is made L. After the timing T3, the logic H of the output of the flip-flop FF2 permits the gate circuit G2 to output an inverted clock signal CLK2 as shown by the waveform 19.

From the timing T3, the inverted clock signal CLK2 is outputted from the gate circuit G2. It should be noted that the output level of the gate circuit G3 is made H for the duration between the timings T2 and T3, and a H level duration of the clock signal CLK2 starts at the timing T3 because the timing T3 is a positive-going edge of the same as described above. Therefore, the output (CLK3) of the gate circuit G3 stays at H near the timing T3, and no thin pulse (obstructive pulse), or glitch is developed at the timing T3.

The logic L of the Q output of the flip-flop FF2 disables the AND gate 1 of the selection circuit SEL1, so that when $\overline{Q}$ output of the flip-flop circuit FF3 changes from L to H at a timing T5, the AND gate 1 keeps the output of the selection circuit SEL1 at H as it was. This change in the circuit condition of the flip-flop circuit FF3 is provided to prepare the next change of the control signal CONT.

The NOR gate G3 outputs a clock signal derived from the clock signal CLK 1 from the gate circuit G1 when the output of the gate circuit G2 is L, on the other hand, it outputs a clock signal derived from the clock signal CLK 2 from the gate circuit G2 when the output of the gate circuit G1 is L. Therefore, as shown by the waveform 18, the output of the gate circuit G1 is L after the timing T2 and the output of the gate circuit G2 is L before the timing T3 as shown by the waveform 19, so that the gate circuit G3 outputs the clock signal derived from the clock signal CLK1 before the timing T2 and outputs the clock signal derived from the clock signal CLK2 after the timing T3 as shown by the waveform 20. Thus, the output of the gate circuit G3 is switched from the clock signal derived from the clock signal CLK1 to clock signal derived from the clock signal CLK2 before and after an output change inhibited period 52. This output change inhibited period 52 prevents an obstructive pulse from occurring.

Figure 3:
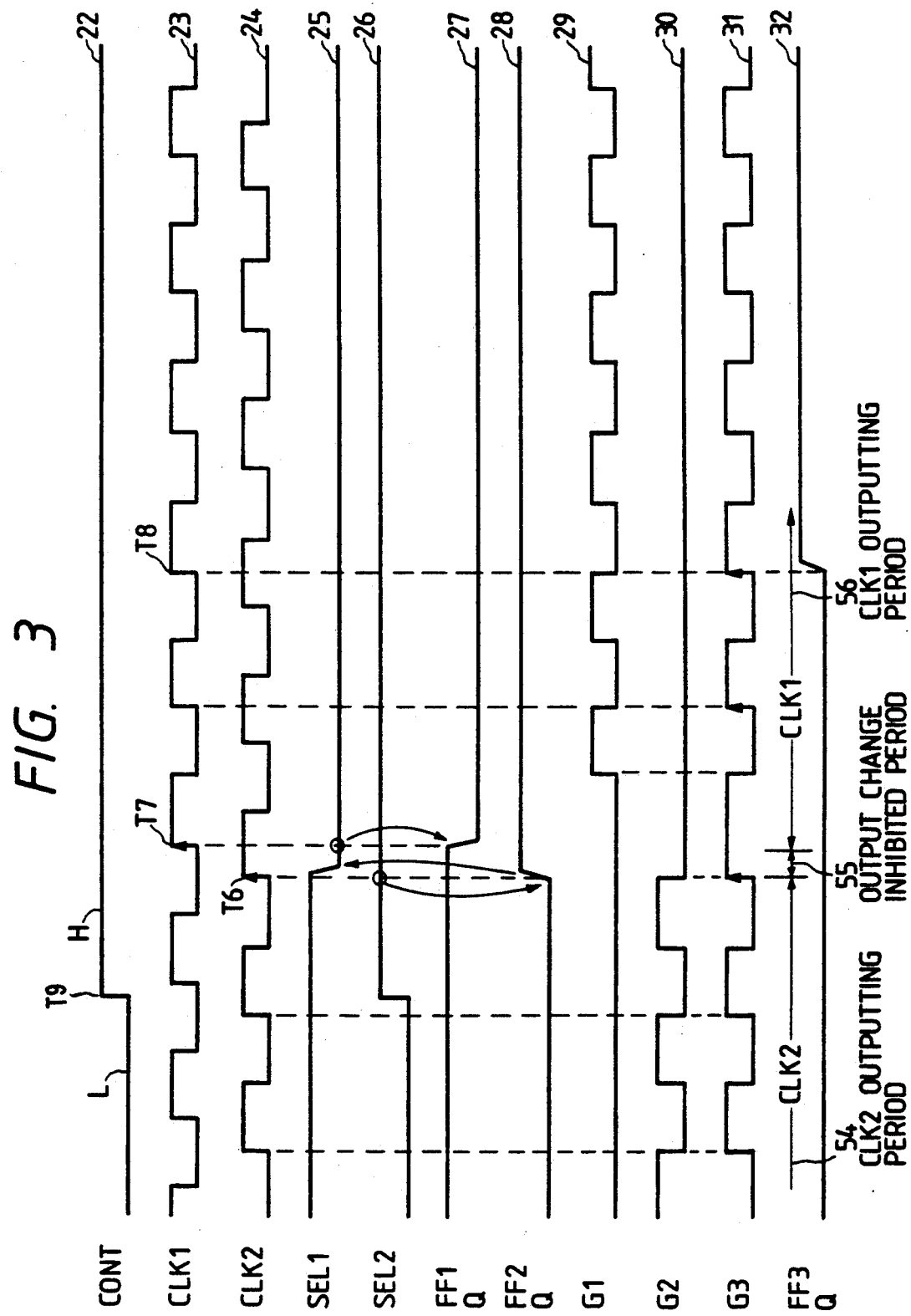
FIG. 3 is a time chart showing waveforms of outputs of the clock signal selection circuit of this embodiment.

FIG. 3 is a time chart showing waveforms of outputs of the clock signal selection circuit of this embodiment during switching of the clock signal from the clock signal CLK2 to the clock signal CLK1. In FIG. 3, waveform 22 shows level change of the control signal CONT; an waveform 23 shows level change of the output of the clock signal CLK1; waveform 24 shows level change of the output of the clock signal CLK2; waveform 25 shows level change of the output of the selection circuit SEL1; waveform 26 shows level change of the output of the selection circuit SEL2; waveform 27 shows level change of the Q output of the flip-flop FF1; waveform 28 shows level change of the Q output of the flip-flop FF2; waveform 29 shows level change of the output of the gate circuit G1; waveform 30 shows level change of an output of the gate circuit G2; waveform 31 shows level change of the output of the gate circuit G3; and waveform 32 shows level change of the Q output of the flip-flop circuit FF3.

The output signal of the selection circuit SEL2 changes in response to the control signal CONT in accordance with condition of flip-flop circuit FF3, that is in accordance with the Q and $\overline{Q}$ outputs of the flip-flop circuit FF3. More specifically, in FIG. 3 as shown by the waveform 32, before a timing T8, the $\overline{Q}$ outputs of the flip-flop circuit FF3 enables the AND gates 1 and 5. On the other hand, Q output of the flip-flop FF3 disables the AND gates 2 and 4 before the timing T8. Therefore, when a logic level of the control signal CONT is changed from L to H at a timing T9 as shown by an waveform 22, only output of the selection circuit SEL 2 changes at first.

The Q and $\overline{Q}$ outputs of the flip-flop circuit FF3 do not change before the timing T8, so that the AND gate 2 is disabled up to the timing T8. In other words, the flip-flop circuit FF3 determines which outputs of the selection circuits SEL1 and SEL2 should be changed in the circuit condition in response to the control signal CONT.

The flip-flop FF2 holds a logic level of the output of the selection circuit SEL 2 at its Q output in response to the clock signal CLK 2. Thus, the Q output of the flip-flop FF2 changes from L to H just after the timing T6 in response to change in logic level of the output of the selection circuit SEL2 from L to H at the timing T9 and then it holds the output level as shown by the waveform 28. Therefore, the Q output of the flip-flop FF2 of logic H inhibits the gate circuit G2 from outputting the inverted clock signal CLK2. At the same instance, the Q output of the flip-flop FF2 changes a logic output level of the selection circuit SEL1 from H to L as shown by the waveform 25. Therefore, the flip-flop FF1 changes its Q output level from H to L in response to the next positive-going edge (T7) of the clock signal CLK 1 to the timing T6 as shown by the waveform 27. This is because the clock pulse input of the same is supplied with the clock signal CLK1. Between the timings T6 and T7, both the gate circuits G1 and G2 are inhibited from outputting the inverted clock signals CLK1 and CLK2 due to the logic H of the Q outputs of the flip-flops FF1 and FF2, and the output level of the gate circuit G3 is made H. After the timing T7, the logic H of the output of the flip-flop FF1 permits the gate circuit G1 to output the inverted clock signal CLK1 as shown by the waveform 29.

After the timing T7, the inverted clock signal CLK1 is outputted from the gate circuit G1. Because the output level of the gate circuit G3 is made H for the duration between the timings T6 and T7, and a H level duration of the clock signal CLK1 starts at the timing T7, the output (CLK3) of the gate circuit G3 stays at H near the timing T7, and no thin pulse, or no glitch is developed near the timing T7.

The logic L of the Q output of the flip-flop FF1 after the timing T8 disables the AND gate 5 of the selection circuit SEL2, so that when Q output of the flip-flop circuit FF3 changes from L to H at a timing T8, the AND gate 5 keeps the output of the selection circuit SEL2 at H. The switching operation from the clocks CLK 1 to CLK2 as shown in FIG. 2 and that from clocks CLK2 to CLK 1 as shown in FIG. 2 alternate because there are two clocks to be selected. That is, the circuit condition of the flip-flop circuit FF3 is changed at T5 to prepare the next change of the control signal CONT. In other words, this change is provided for the switching operation from T9, as amended, to T8. Moreover, the circuit condition of the flip-flop circuit FF3 at T8 is provided for the switching operation from T1 to T5.

Therefore, this clock signal section circuit provides a surer clock selection between two clock signals without delay elements.

Figure 4:
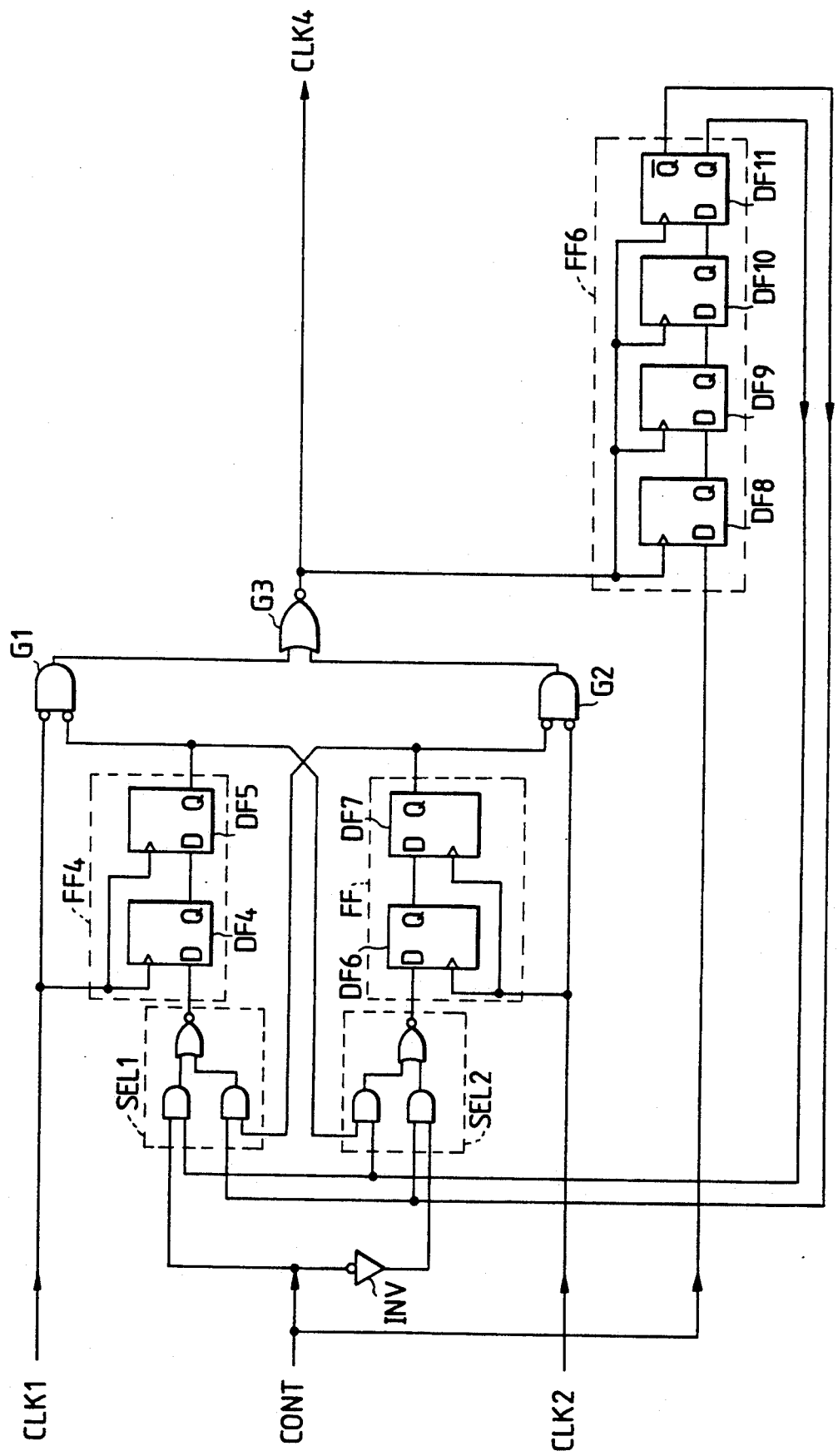
FIG. 4 is a logic circuit diagram of a second embodiment of the invention.
Figure 5:
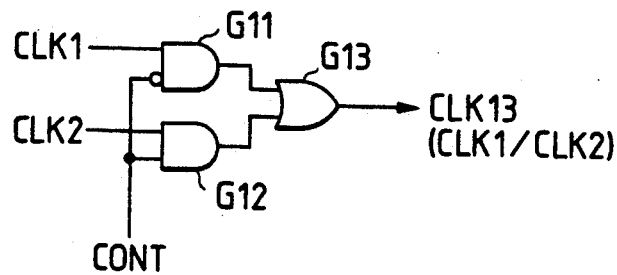
FIG. 5 is a logic circuit diagram of a first prior art of a clock signal selection circuit.
Figure 6:
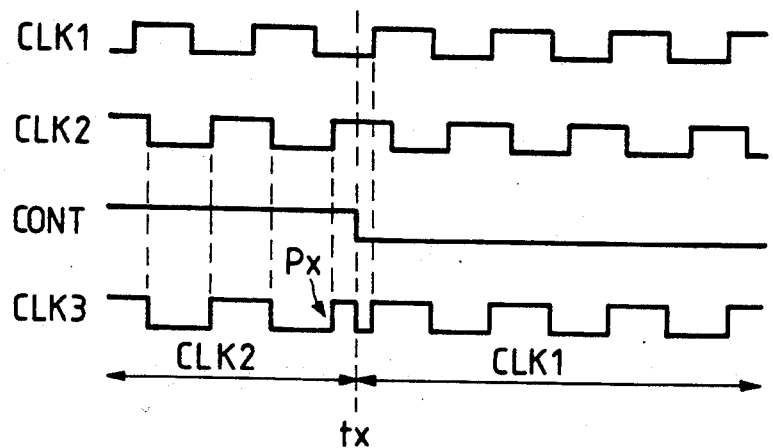
FIG. 6 is a time chart showing waveforms of outputs of the clock signal selection circuit of the first prior art.
Figure 7:
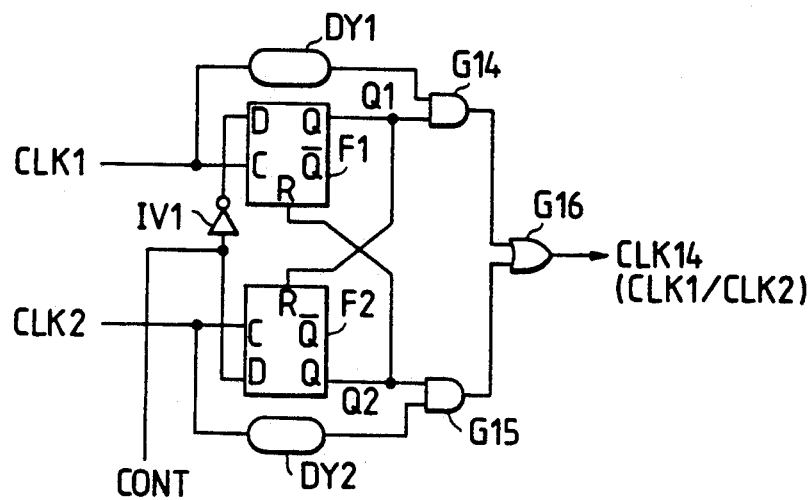
FIG. 7 is a logic circuit diagram of a second prior art of a clock signal selection circuit.
Figure 8:
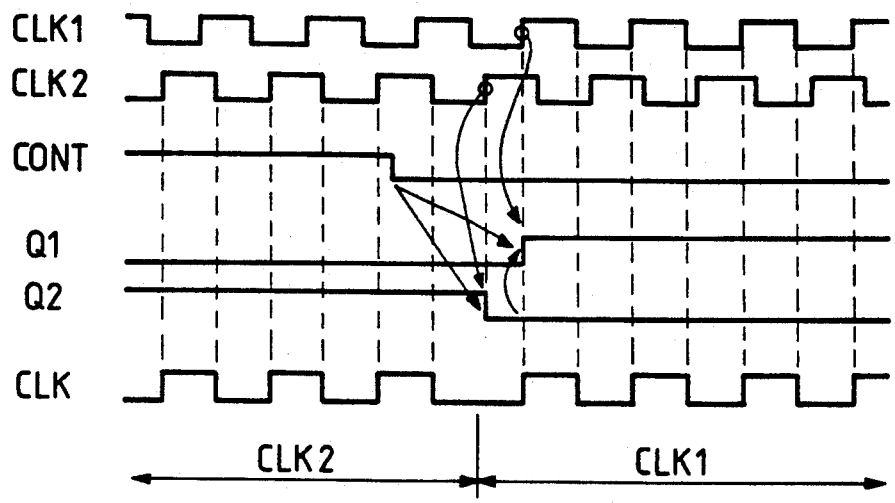
FIG. 8 is a time chart showing waveforms of outputs of the clock signal selection circuit of the second prior art.
Figure 9:
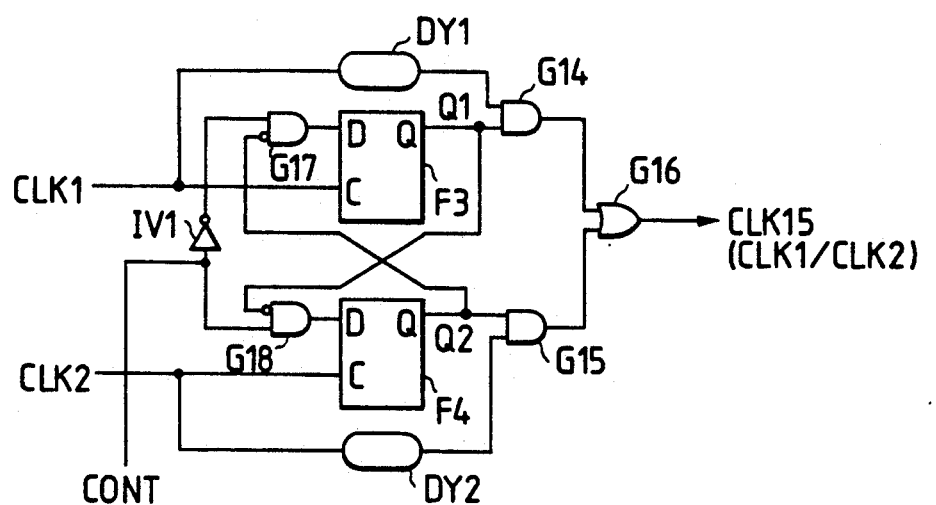
FIG. 9 is a logic circuit diagram of a third prior art of a clock signal selection circuit.

FIG. 4 is a logic circuit diagram of a second embodiment of the invention.

Basic structure of the second embodiment is the same as that of the first embodiment. Therefore, the basic operation of the clock signal selection circuit of the second embodiment is the same as that of the first embodiment, so that a detailed description of structure is omitted. There are differences that a flip-flop circuit FF4 corresponding to the flip-flop FF1 of the first embodiment comprises two D flip-flops DF4 and DF5; a flip-flop circuit FF5 corresponding to the flip-flop FF2 of the first embodiment comprises two D flip-flops DF6 and DF7; and a flip-flop circuit FF6 corresponding to the flip-flop circuit FF3 of the first embodiment comprises four D flip-flops DF8, DF9, DF10, and DF11. However, respective outputs of the clock selection circuit of FIG. 4 change in response the control signal CONT with longer intervals, that is, this clock signal selection circuit needs more pulses of the clock signals for switching two clock signals CLK1 and CLK2. Therefore, the basic operation of the clock signal selection circuit of the second embodiment is the same as that of the first embodiment, so that a detailed description of operation is omitted.

The second embodiment of the clock signal switching circuit prevents metastable condition from occurring by increasing the number of the flip-flops.

As mentioned, according to the embodiments of the invention, there is no delay element whose delay characteristic should be controlled, so that this clock signal selection circuit can be made as an integrated circuit.

What is claimed is:

1. A clock signal selection circuit comprising:
   (a) first and second selection means;
   (b) first and second holding means for holding an input level therein at its output in response to first and second clock signals respectively;
   (c) first gate means responsive to said first clock signal for outputting a gated first clock signal in accordance with an output of said first holding means;
   (d) second gate means responsive to said second clock signal for outputting a gated second clock signal in accordance with an output of said second holding means;
   (e) third gate means for operating and outputting a logic OR of said first and second gated clock signals; and
   (f) delay means for delaying a switching control signal to produce a delayed switching control signal,
   wherein said first selection means selects either of (i) said switching control signal or (ii) said output of said second holding means in accordance with a condition of said delayed switching control signal;
   said first holding means holds an output of said first selection means in phase with a first clock signal;
   said second selection means selects either of (i) said switching control signal or (ii) said output of said first holding means in accordance with a condition of said delayed switching control signal; and
   said second holding means holds an output of said second selection means in phase with said second clock signal.

2. A clock signal selection circuit as claimed in claim 1, wherein said delay means comprises a plurality of D type flip-flop circuits for delaying said switching control signal in response to said gated first and second clock signals through said third gate means.

3. A clock signal selection circuit comprising:
   (a) delay means for delaying a switching control signal to produce a switching delayed control signal;
   (b) first selection circuit means for changing its circuit condition between first and second states in response to a present transition of said switching control signal;
   (c) second selection circuit means for changing its circuit condition between third and fourth states in response to said switching control signal and said output of first selection circuit means, said second selection circuit means supplying a second clock signal in said third state, said second selection circuit means inhibiting a transmission of said second clock signal in said fourth state, said first selection circuit means outputting said first clock signal in said first state, said first selection circuit means inhibiting a transmission of said first clock signal in said second state in response to said switching control signal and said output of second selection circuit means;
   (d) third selection circuit means for selectively supplying said present transition of said switching control signal to either of said first or second selection circuit means in accordance with a condition of said delayed control signal which has been determined at a previous transition of said switching control signal; and (e) gate means for operating and outputting a logic OR of said first and second clock signals from said first and second selection means respectively.

4. A clock signal selection circuit as claimed in claim 3, wherein said delay means comprises a plurality of D type flip-flop circuits for delaying said switching control signal in response to said first and second clock signals from said first and second selection means through said third gate means.

5. A clock signal selection circuit for selectively outputting first and second clock signals comprising:
   (a) delay means for delaying a switching control signal to produce a switching delayed control signal;
   (b) first selection circuit means including first switch means for changing its circuit condition between first and second states in response to a present transition of said switching control signal;
   (c) second selection circuit means including second switching means for changing its circuit condition between third and fourth states in response to said switching control signal and said output of first selection circuit means, said second selection circuit means supplying said second clock signal in said third state, said second selection circuit means inhibiting transmission of said second clock signal when operated in said fourth state, said first selection circuit means supplying said first clock signal in said first state, said first selection circuit means inhibiting transmission of said first clock signal when operated in said second condition in response to said switching control signal and said output of second selection circuit means; and
   (d) third selection circuit means including said first and second switch means for selectively enabling said switching control signal in either of said first or second selection circuit means in accordance with a condition of said delayed control signal which has been determined at a previous transition of said switching control signal.

* * * * *